United States Patent [19]

Yoshida et al.

[11] Patent Number: 5,467,310
[45] Date of Patent: Nov. 14, 1995

[54] EEPROM AND EEPROM READING METHOD

[75] Inventors: Masanobu Yoshida, Kawasaki; Kiyonori Ogura, Kasugai, both of Japan

[73] Assignees: Fujitsu Limited, Kanagawa; Fujitsu VLSI Limited, Aichi, both of Japan

[21] Appl. No.: 292,748

[22] Filed: Aug. 18, 1994

Related U.S. Application Data

[63] Continuation of Ser. No. 817,075, Jan. 6, 1992, abandoned.

[30] Foreign Application Priority Data

Jan. 16, 1991 [JP] Japan ................................. 3-003272

[51] Int. Cl.$^6$ .................................................. G11C 11/34
[52] U.S. Cl. ............................... 365/185.07; 365/189.09; 365/189.11
[58] Field of Search ............................... 365/900, 189.01, 365/185, 218, 189.09, 189.11

[56] References Cited

U.S. PATENT DOCUMENTS

| | | | |
|---|---|---|---|
| 4,366,555 | 12/1982 | Hu | 365/185 |
| 4,695,979 | 9/1987 | Tuvell et al. | 365/185 |
| 5,097,444 | 3/1992 | Fong | 365/185 |

FOREIGN PATENT DOCUMENTS

| | | | |
|---|---|---|---|
| 0098079 | 6/1983 | European Pat. Off. | 365/185 |
| 0164868 | 12/1985 | European Pat. Off. | |
| 0028875 | 2/1983 | Japan | 365/185 |

OTHER PUBLICATIONS

IBM Technical Disclosure Bulletin, vol. 27, No. 4B, Sep. 1984, pp. 2726–2729.

IEEE Journal of Solid–State Circuits, vol. 24, No. 5, Oct. 1989, "A 23 NS 256K EPROM with Double Layer Metal and Address Transition Detection", Hoff et al., pp. 1250–1258.

1990 Symposium On VLSI Circuits, Jun. 1990, Honolulu, USA, "A 4 MB 5 V Only Flash EEPROM with Sector Erase", Stiegler et al, p. 103–104.

Primary Examiner—David C. Nelms
Assistant Examiner—Son Dinh
Attorney, Agent, or Firm—Staas & Halsey

[57] ABSTRACT

An electrically programmable and electrically erasable non-volatile semiconductor memory device having an array of single transistor cells is provided. The disclosed device protects against reading faults even in the event that adjacent transistors may be over erased. Each of the cell transistor rows has an associated word line and an associated select element. The select elements are connected to the sources of their associated cell transistors and are arranged to activate those cell transistors only when their associated word line is selected. Cell transistors in unselected rows are not activated and thus do not interfere with reading even if they are in an over erased condition.

13 Claims, 12 Drawing Sheets

EEPROM AND EEPROM READING METHOD

This application is a continuation, of application Ser. No. 07/817,075, filed Jan. 6, 1992, now abandoned.

BACKGROUND OF THE INVENTION

1. Field of the Invention

The present invention relates generally to a non-volatile electrically erasable semiconductor memory device. More particularly, the invention relates to an over-erase protection scheme for EEPROMs.

2. Description of the Related Art

Recently, personal computers have become popular due to their ability to deliver good computing performance at affordable prices. Although present computers are quite powerful and efficient, there are continuing efforts to increase their performance by increasing speed and lowering costs. One traditional source of time delays in computing systems has been the amount of time required to access auxiliary memory devices. In particular, the magnetic disc auxiliary memory devices are considered quite slow. Therefore, semiconductor memory devices tend to be used as an auxiliary memory device.

Most semiconductor memory devices presently available for use as auxiliary memory devices are DRAMs (SRAMs are seldom used). However, if power is cut off, data stored in a DRAM will be erased. Therefore DRAMs require a backup battery, which is disadvantageous.

Because of the above drawbacks of the most popular auxiliary memory devices, EEPROMs (Electrical Erasable Programmable Read Only Memories), which are electrically programmable, are now being proposed for use as auxiliary semiconductor memory devices. Traditional EEPROMs require two transistors per cell. However, such EEPROMs suffer the drawback of requiring a relatively large area per cell, which in turn results in higher fabrication cost. The use of all-erase (flash-erase) EEPROMs whose cell area is similar in size to ultraviolet-erasable EPROMs (Erasable Programmable Read Only Memories) is being reviewed.

A single transistor EEPROM cell in the form of a tunnel-erase/avalanche-write cell transistor C is shown schematically in FIG. 13. This transistor C has a double-gate structure including a floating gate. As seen in FIG. 14, when data "0" is to be written into such a cell transistor, a high voltage $V_{pp}$ is applied to both the drain and the control gate while the source is connected to a ground GND. With this arrangement, electrons are injected and a charge accumulates in the floating gate. After the data "0" is written through this operation, the cell transistor C operates as indicated by a characteristic curve D0 shown in FIG. 12. Accordingly, when a 1/0 determination voltage $V_{0/1}$ or a cell select signal is applied to the control gate, no current ($I_{DS}$) flows between the drain and the source. Thus, the cell transistor C is effectively "off".

As shown in FIG. 13, in order to erase the written data "0", the drain is opened, the control gate is connected to ground GND, and a high voltage $V_{pp}$ is applied to the source. This removes the charge from the floating gate. The cell transistor C, after the data erase, operates as indicated by a characteristic curve D1 in FIG. 12. Thus, the cell transistor C is turned "on" when the 1/0 determination voltage $V_{0/1}$ is applied to the control gate. The condition where a transistor C is turned "on" when subjected to the 1/0 determination value is read as data "1" in that transistor.

An example of a conventional cell array consisting of cell transistors of this type will be explained below referring to FIG. 11. Each row of cell transistors C have their control gates commonly connected to a word line $WL_m$. For example, a word line $WL_1$ is commonly connected to the control gates of cell transistors $C_{11}$ to $C_{1j}$. Each column of multiple cell transistors C have their drains commonly connected to a bit line $BL_n$. Every cell transistor C has its source connected to ground GND. A voltage $V_{cc}$ is applied to the bit lines $BL_1$ to $BL_j$ through load resistors $R2_1$ to $R2_j$, for example, in order to steadily set the potentials of the cell transistors depending on whether data is written in the cell transistors.

When one word line and one bit line are selected from among the lines $WL_1$ to $WL_i$ and $BL_1$ to $BL_j$, respectively, a single cell transistor is selected. Specifically, the selected cell is the cell $C_{mn}$ where the selected work line $WL_m$ and selected bit line $BL_n$ cross each other. If the data "0" is stored in the cell transistor $C_{mn}$, the cell transistor $C_{mn}$ is turned "off" and the selected bit line $BL_n$ becomes a high level. On the other hand, if the data "1" is stored in the cell transistor $C_{mn}$, the cell transistor $C_{mn}$ is turned on, and the selected bit line $BL_n$ becomes a low level. The potential of the bit line is then read out as cell information by a sense amplifier.

The drawback of this arrangement is that if too many electrons are removed from the floating gate of a cell transistor C while erasing the data "0", this cell transistor C will be "over-erased". In the over-erased condition, the cell transistor C operates according to a characteristic curve $D1_0$ as shown in FIG. 12. That is, it now has a negative threshold voltage, and will thus always be in a depletion condition such that it is always effectively "on". When a particular cell transistor C is in an over-erase condition, the potential of the bit line BL connected to that cell transistor C will always be low. Thus, if another cell transistor C connected to the same bit line BL is selected, its cell information cannot be read out, thereby causing a reading failure.

One proposal for overcoming this shortcoming contemplates an erasing method which repeats electrical erasing and data reading until the threshold value of the erased cell transistor becomes a certain value, while checking to insure that the threshold value does not fall negative. However, this method requires a considerable amount of CPU and bus time to control the erasing operations, which undesirably decreases the operation speed of the computer system.

SUMMARY OF THE INVENTION

It is therefore an object of the present invention to provide a non-volatile semiconductor memory device which has a cell array consisting of tunnel-erase/avalanche-write cell transistors with a double-gate structure including a floating gate, and prevents reading failure even when a cell is over-erased.

In order to accomplish this and other objects of the invention, an electrically programmable and electrically erasable non-volatile semiconductor memory device is provided. The disclosed device includes a cell array having a plurality of electrically erasable and programmable non-volatile cell transistors arranged in rows and columns. Each cell transistor includes a source, a drain and a control gate. Each of the cell transistor rows has an associated word line. The word lines are connected to the control gates of each of their associated cell transistors. Each cell transistor column has an associated bit line. Thus, the word lines and bit lines are arranged such that any one of said cell transistors can be selected for writing or reading cell information by selecting its associated word and bit lines.

Each row also has an associated first select element that is connected to the sources of its associated cell transistors. The first select elements are arranged to activate the selected cell transistor in synchronism with the selection of their associated word lines by electrically connecting the sources of their associated cell transistors to a first power supply when their associated word line is selected.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

Figure 1:
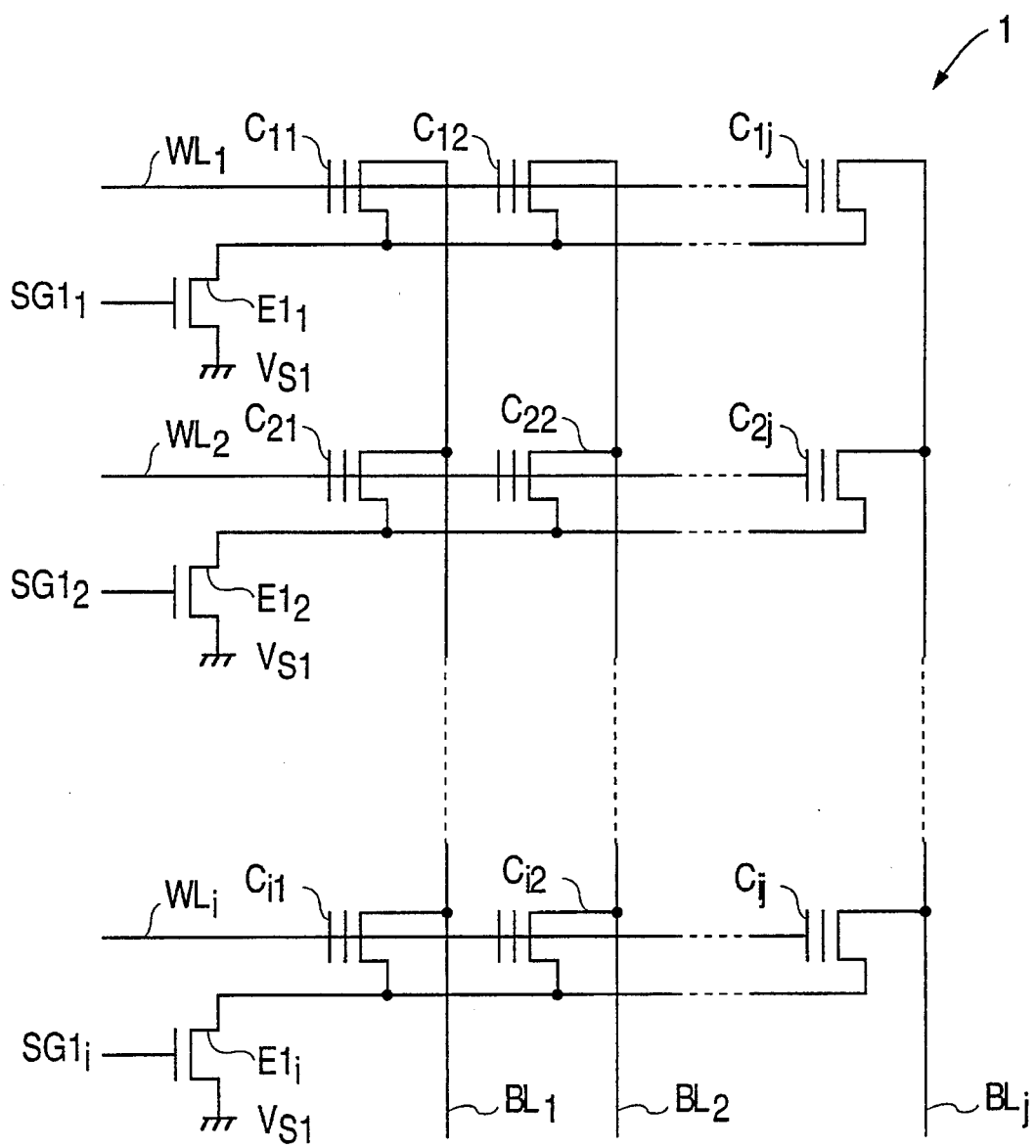
FIG. 1 is a schematic diagram illustrating a first embodiment of the present invention.

The principle of the present invention will be initially explained with reference to FIG. 1. A cell array 1 comprises a plurality of electrically erasable and programmable non-volatile cell transistors $C_{ij}$ arranged in rows and columns.

A common word line $WL_m$ (where m is an integer between 1 and i) is connected to each row of cell transistors $C_{mj}$, and a common bit line $BL_n$ (where n is an integer between 1 and j) is connected to each column of cell transistors $C_{in}$. By selecting one of the word lines $WL_m$ and one of the bit lines $BL_n$, a single cell transistor $C_{mn}$ is selected to write in or read out cell information.

A common first select element $E1_m$ for activating a row of cell transistors $C_{mj}$ is connected to the sources of each of the cell transistors $C_{mj}$ in a particular row. When activated, the first select element $E1_m$ electrically connects the sources of the cell transistors $C_{mj}$ to a power supply $V_{S1}$. The first select element $E1_m$ is turned on by a first select signal $SG1_m$ which is sent in synchronism with the selection of the word line $WL_m$ that selects that row.

Figure 2:
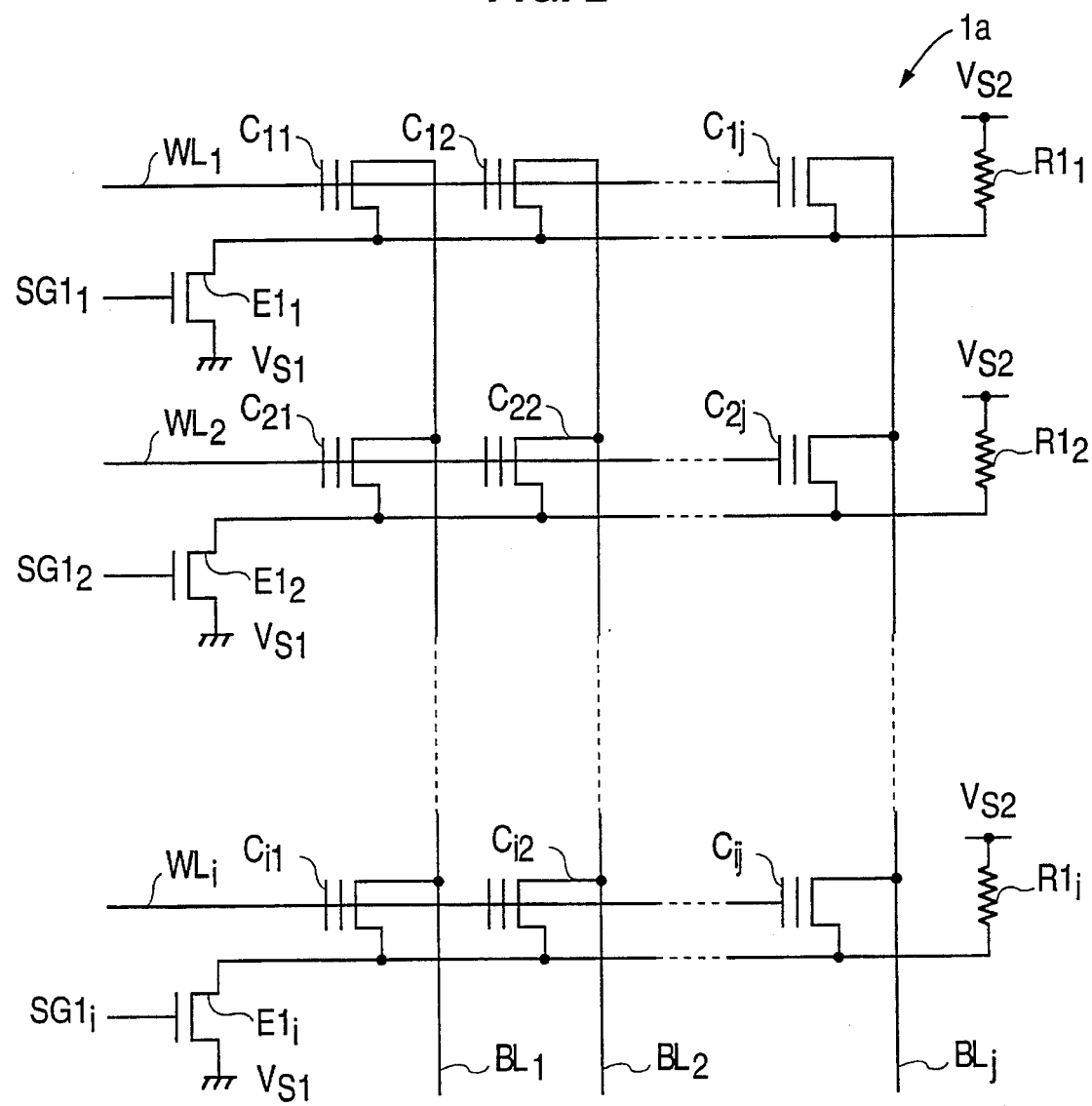
FIG. 2 is a schematic diagram illustrating a second embodiment of the present invention.
Figure 4:
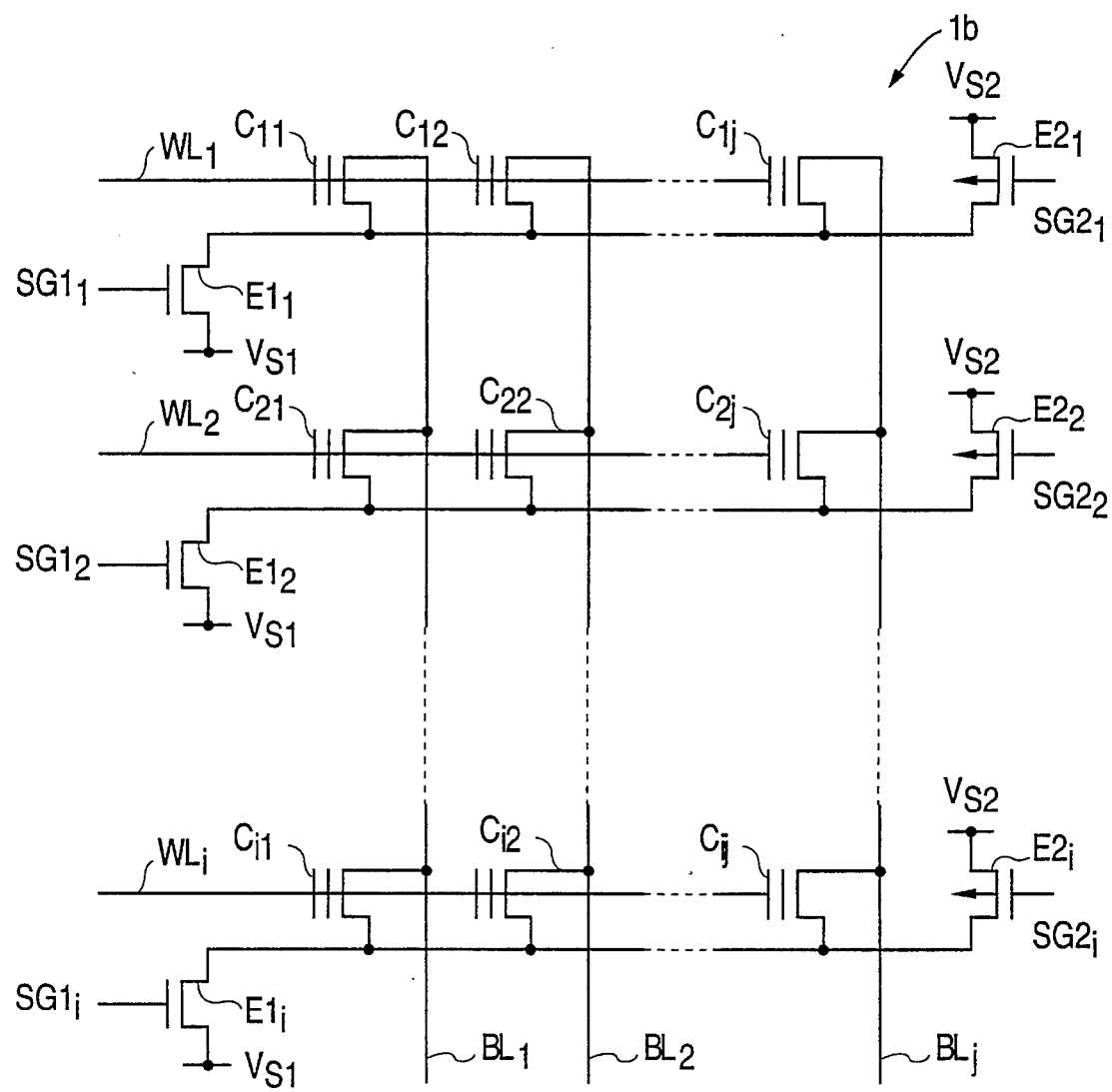
FIG. 4 is a schematic diagram illustrating a third embodiment of the present invention.

In an alternative embodiment to be discussed in more detail below, a second power supply $V_{S2}$ may be provided for deactivating the cell transistors $C_{mj}$ when the first select element $E1_m$ is inactive. As seen in FIG. 2, the second power supply may be coupled to the sources of a row of cell transistors $C_{mj}$ through an associated resistor $R1_m$. Alternatively, as shown in FIG. 4, each row of cell transistor sources may be coupled to the power supply $V_{S2}$, through an associated second select element $E2_m$. In this embodiment, the second select element $E2_m$ is a transistor having its gate supplied with a second select signal $SG2_m$, which is synchronized with the first select signal $SG1_m$.

When the m-th word line $WL_m$, is selected, the first select element $E1_m$ corresponding to that word line $WL_m$ is turned "on", thereby activating the cell transistors $C_{mj}$ connected to the corresponding word line $WL_m$. If the n-th bit line $BL_n$ is then selected in this condition, cell information is only read from the selected cell transistor $C_{mn}$ onto the bit line $BL_n$.

On the other hand, when the word line $WL_m$ is not selected, the first select element $E1_m$ associated with that word line is turned "off". Accordingly, the sources of the cell transistors $C_{mj}$ in the unselected row are not grounded, thus these cell transistors $C_{mj}$ are deactivated. Indeed, in the embodiments shown in FIGS. 2 and 4 the sources of the cell transistors C in the non selected rows are coupled to power supply $V_{S2}$. This insures deactivation.

The second embodiment of the present invention will now be described in detail referring to FIGS. 2 and 3. A cell array 1a shown in FIG. 2 includes a multiplicity of cell transistors $C_{11}$ to $C_{ij}$ provided in i rows and j columns. The rows of cell transistors have their control gates respectively connected to word lines $WL_1$ to $WL_i$, and the columns of the cell transistors have their drains connected respectively to the bit lines $BL_1$ to $BL_j$.

The sources of the cell transistors in each row (1-i) are connected to an associated first select element $E1_{1-i}$. In this embodiment, the first select elements are N-channel MOS transistors $E1_1$ to $E1_i$. Therefore, the sources of the cell transistors $C_{mj}$ are each connected to the drain of the associated first select element transistor $E_m$. The sources of the cell transistors are powered by $V_{S2}$ through resistors $R1_1$ to $R1_i$. The first select signals $SG1_1$ to $SG1_i$, which are synchronized with the selection of the corresponding word lines $WL_1$ to $WL_i$, are sent to the gates of the select transistors $E1_1$ to $E1_i$, respectively. The sources of the select transistors $E1_1$ to $E1_i$ are connected to the power supply $V_{S1}$. That is, grounded in this embodiment.

In the cell array 1a with this arrangement, when the word line $WL_1$ is selected, for example, a cell select signal is sent to the control gates of the cell transistors $C_{11}$ to $C_{1j}$. A select signal $SG1_1$ is input to the gate of the select transistor $E1_1$ (only) in synchronism with the input of the cell select signal, thereby turning the select transistor $E1_1$ on. Accordingly, the potentials of the sources of the cell transistors $C_{11}$ to $C_{1j}$ drop to ground level. When the bit line $BL_1$ is selected under these conditions, the cell transistor $C_{11}$ is selected and cell information is read from that cell transistor onto the bit line $BL_1$. If data "0" is written in the cell transistor $C_{11}$, the cell transistor $C_{11}$ is turned off and the bit line $BL_1$ is "high". On the other hand, if data "1" is written in the cell transistor $C_{11}$, the cell transistor $C_{11}$ is turned on, which sets the bit line $BL_1$ at a low level.

It is noted that only the select element associated with the selected word line is turned on. Thus, in the example above, only the select transistor $E1_1$ would be turn on while the remaining transistors remain off. Therefore, even if one of the other cell transistors $C_{21}$ to $C_{i1}$ connected to the bit line $BL_1$ is over-erased such that it is always "on", the source of the over-erased cell transistor(s) is not grounded. Accordingly, the information in the cell transistor $C_{11}$ can be read without interference from the over-erased transistor. Thus, with the described arrangement, cell information can always be read from the selected cell transistor even if one of the cell transistors in the cell array $1a$ is over-erased.

A peripheral circuit suitable for accomplishing the data writing, data reading and data erasing functions, in cooperation with the above-described cell array $1a$ will now be functionally described with reference to FIG. 3. In order to simplify this explanation, the cell array $1a$ for this example is a simple 2×2 matrix. Thus the address bus in FIG. 3 includes a single word-line select signal input terminal A0 and a single bit-line select signal input terminal A1. Reference numerals "$2a$" to "$2g$" denote AND gates, "Tr1" to "Tr6" N-channel MOS transistors, and "$3a$" an invertor. The terminal $V_{S1}$ of the cell array $1a$ is connected to the ground GND, and to the sources of the select transistors $E1_1$ to $E1_i$ in the cell array $1a$. The AND gates $2b$ and $2c$ output a high voltage $V_{pp}$ to write data in the cell transistors, while the AND gates $2f$ and $2g$ output the high voltage $V_{pp}$ when erasing data.

Figure 3:
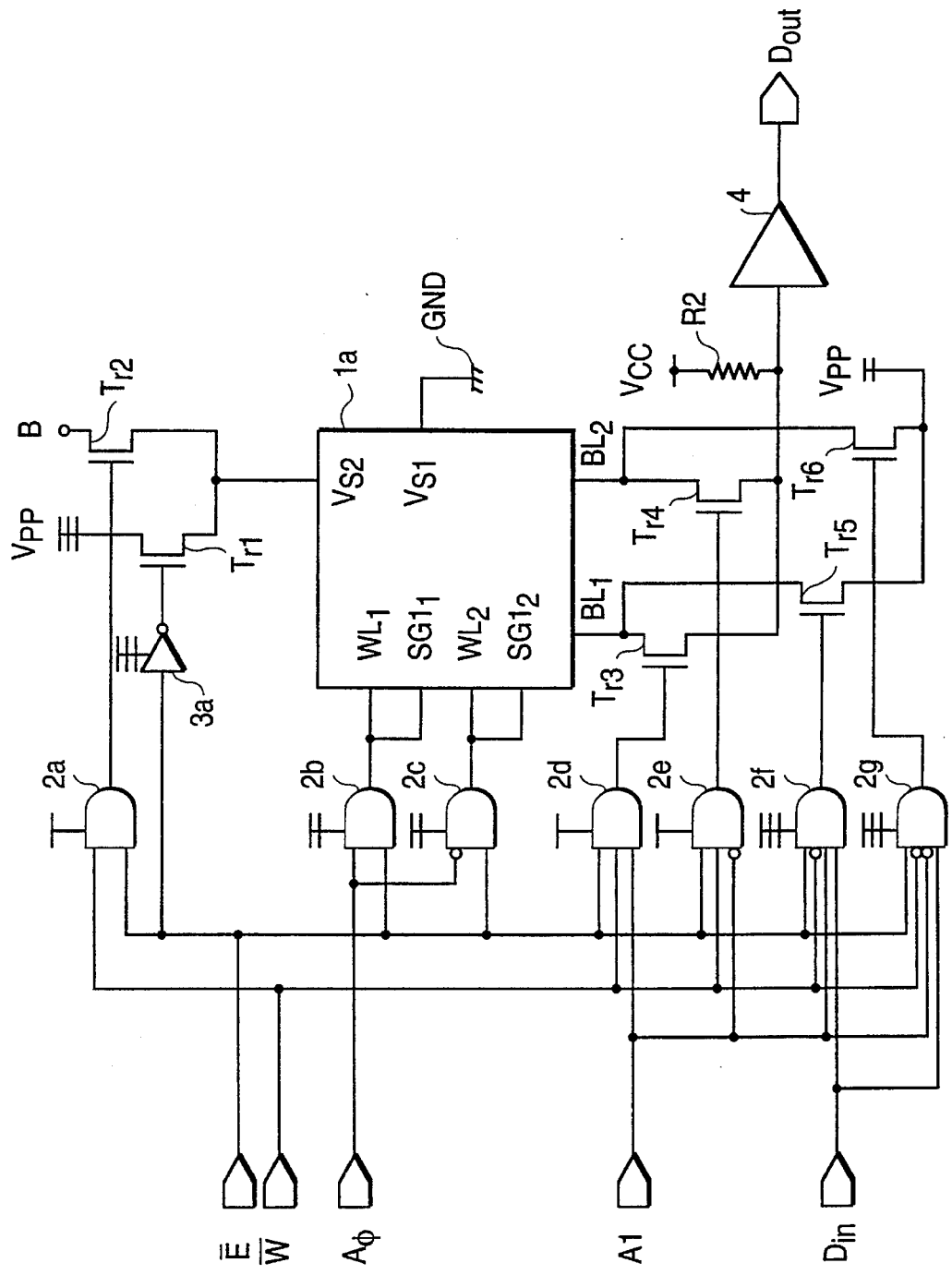
FIG. 3 is a circuit diagram illustrating the essential sections of a semiconductor memory device using a cell array in accordance with the second embodiment of this invention.

As seen in FIG. 3, components such as AND gate $2a$ and other components that output $V_{cc}$ level signals are marked by single bar power supplies. Components that are marked by a double bar power supply, such as AND gates $2b$ and $2c$, output $V_{cc}$ or $V_{pp}$ level signals depending on the EEPROM's mode. Components that are marked by triple bar power supplies, such as And gates $2f$ and $2g$ output $V_{pp}$ level signals In a data reading mode, an erase signal $\overline{E}$ and a write signal $\overline{W}$ as seen in FIG. 3 are both "high". In this condition, the AND gate $2a$ outputs a high-level signal, which turns the transistor Tr2 "on". At the same time, the output signal of the invertor $3a$ (which is connected to the erase signal line $\overline{E}$) is "low", which turns the transistor Tr1 off. Accordingly, a bias voltage B which is set at the desired 0/1 determination voltage is supplied to the power supply terminal $V_{S2}$ of the cell array $1a$.

When reading data, the data address is supplied to the address lines A0 and A1. In this simplified embodiment, the A0 line contains the word line information, while the A1 line contains the bit line information. Thus, the first word line can be selected by sending a high signal to terminal A0. Specifically, when the address signal A0 is high, the output signal of the AND gate $2b$ is also high since the second input of the AND gate $2b$ is connected to the erase line. At the same time, the output signal of the AND gate $2c$ is at a low level. This effectively selects the word line $WL_1$ which is now at a high level. That is, $V_{pp}$. At the same time, a high-level select signal $SG1_1$ is sent to the gate of the first select transistor $E1_1$, thereby turning on the first select transistor as discussed previously.

At the same time, the selected bit line information is transferred over address line A1. Again, in this simplified example, the first bit line can be selected merely by making the address signal A1 high. Specifically, when a high signal A1 is sent, the output signal of the AND gate $2d$ becomes high and the output signal of the AND gate $2e$ is low. Consequently, the transistor Tr3 is turned on to select the bit line $BL_1$ by connecting the bit line $BL_1$ to a sense amplifier 4. The cell information of the selected cell transistor is then amplified by the sense amplifier 4 to output a signal as an output signal $D_{out}$. It is therefore possible to read out cell information of the cell transistor selected according to the address signal.

In order to write data, a high level erase signal $\overline{E}$ and a low level write signal $\overline{W}$ are input. In this mode, the low level write signal makes the output of the AND gate $2a$ low. At the same time the invertor $3a$ is also low since the erase signal is high. Accordingly, both the transistors Tr1 and Tr2 are off. No voltage is therefore supplied to the power supply terminal of the cell array $1a$. If the address signal for cell $C_{11}$ is input, line A0 is high. Accordingly the AND gate $2b$ outputs a high voltage $V_{pp}$ for data writing. This high voltage signal is supplied from the AND gate $2b$ to the word line $WL_1$ and the gate of the select transistor $E1_1$. The voltage $V_{pp}$ is therefore applied to the control gates of all of the cell transistors $C_{11}$ to $C_{1j}$ connected to the word line $WL_1$. At the same time, a high-level select signal $SG1_1$ is sent to the gate of the first select transistor $E1_1$, thereby turning on the first select transistor which connects the sources of the first line cell transistors to ground GND.

At the same time, the output signals of the AND gates $2d$ and $2e$ are low due to the low-level write signal $\overline{W}$. When a high-level input data $D_{in}$ is input to the AND gates $2f$ and $2g$, one of the AND gates $2f$ and $2g$ becomes a high level, and the other a low level, permitting the voltage $V_{pp}$ to be supplied via the transistor Tr5 or Tr6 to either bit line $BL_1$ or $BL_2$. The selected cell transistor therefore has the control gate and drain supplied with the voltage $V_{pp}$, and the source connected to the ground GND, so that data is written there. As a voltage $V_{cc}$ is applied as an input signal to the sense amplifier 4 through the resistor R2, the output signal will be fixed at a high level.

When an erasing operation is performed, the erase signal $\overline{E}$ is set at a low level. Consequently, the output signal of the AND gate $2a$ is low, and the output signal of the invertor $3a$ becomes high. The high voltage $V_{pp}$ is thus applied to the voltage supply terminal $V_{S2}$ in the cell array $1a$. The output signals of the AND gates $2b$ to $2g$ are all low regardless of the address signals A0 and A1, and the input data Din, rendering the transistors Tr3 to Tr6 off. The individual cell transistors in the cell array $1a$ therefore have the drains open, the control gates supplied with a low-level signal, and the sources supplied with the high voltages $V_{pp}$. Accordingly, data is erased from each of the cell transistors at the same time.

Although the peripheral circuitry has been described as applied to a simple cell matrix, it will be readily apparent to those skilled in the art how the peripheral circuitry can be arranged to apply practically sized EEPROMs.

Figure 5:
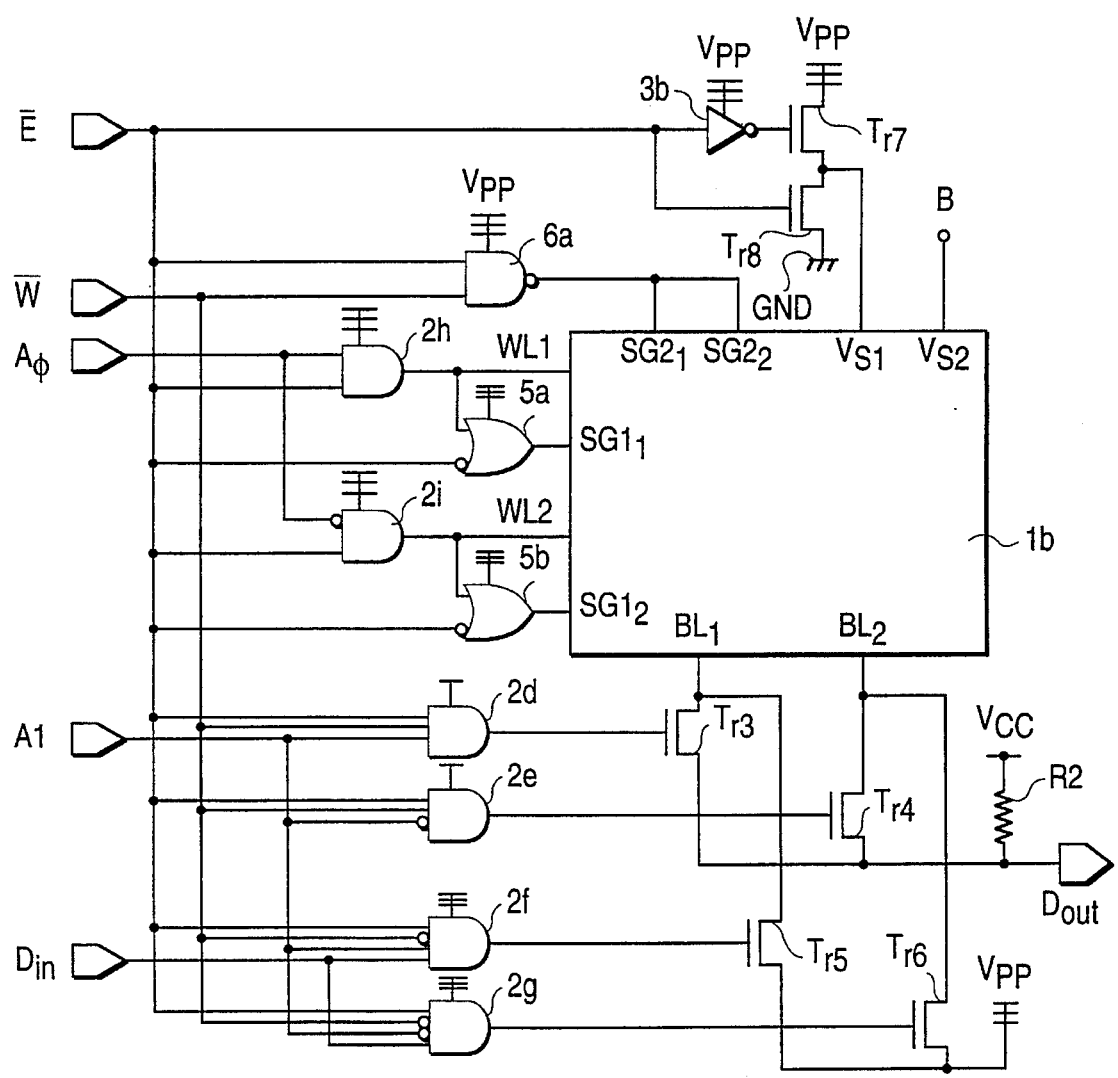
FIG. 5 is a circuit diagram illustrating the essential sections of a semiconductor memory device using a cell array in accordance with the third embodiment of this invention.

A third embodiment of the present invention will now be described referring to FIGS. 4 and 5. The layout of the third embodiment is very similar to the layout of the first embodiment. Accordingly, where appropriate, similar numbers are used to designate similar components. The cell array 1b in this embodiment has P-channel MOS transistors $E2_1$ to $E2_i$ as its second select elements in place of the resistors $R1_1$ to $R1_i$ of the cell array 1a in the first embodiment. Select signals $SG2_1$ to $SG2_2$ are sent to the gates of the respective select transistors $E2_1$ to $E2_i$.

Again, an appropriate peripheral drive circuit will be explained as applied to a 2 by 2 cell matrix to simplify the explanation of the invention. A suitable peripheral drive circuit is shown in FIG. 5. Reference numerals "Tr7" and "Tr8" denote N-channel MOS transistors, "2h" and "2i" AND gates, "5a" and "5b" OR Gates, "3b" an invertor, and "6a" a NAND gate. The bias voltage B is always supplied to the terminal $V_{S2}$ of the cell array 1b, and is thus connected to the sources of the select transistors $E2_1$ to $E2_i$.

To read data from cell array 1b, the erase signal $\overline{E}$ and the write signal $\overline{W}$ are set high. Thus the transistor Tr7 is turned off and the transistor Tr8 on. The potential at the ground (GND) level is thus supplied to the terminal $V_{S1}$ of the cell array 1b, and the sources of the select transistors $E1_1$ to $E1_i$ have the ground potential in the cell array 1b. Since the NAND gate 6a outputs a low-level signal, the select transistors $E2_1$ to $E2_i$ are rendered on in the cell array 1b, thereby supplying the bias voltage B to the sources of the individual cell transistors.

If the address of cell $C_{11}$ is applied to the address lines, the levels of the address signals A0 and A1 are each high. Thus, the output signals of the AND gate 2h and the OR gate 5a are both "high". At the same time, the output signals of AND gate 2i and OR gate 5b are both "low". Accordingly, the word line $WL_1$ is selected and a select signal $SG1_1$ is sent to the select transistor $E1_1$ associated with that word line $WL_1$. As a result, the cell transistors $C_{11}$ to $C_{1j}$ are activated and the select transistor $E1_1$ is turned on, setting the sources of the individual cell transistors $C_{11}$ to $C_{1j}$ at the ground level. The output signal of the AND gate 2d becomes high, and those of the AND gates 2e to 2g become low, which turn the transistor Tr3 on. Consequently, the bit line $BL_1$ is selected which combines with selected word line $WL_1$ to select the cell transistor $C_{11}$. The cell information of that cell transistor $C_{11}$ is then read out via the bit line $BL_1$, and is amplified by the sense amplifier to be an output signal $D_{out}$.

At this time, the select transistors $E1_2$ to $E1_i$ are off. Therefore, even if one or more of the other cell transistors $C_{21}$ to $C_{it}$ connected to the bit line $BL_1$ is in an over-erase condition, reading cell information from the cell transistor $C_{11}$ is not affected at all. Cell information of other cell transistors can likewise be read out based on the address signal.

Meanwhile, when an erasing operation is performed, the erase signal $\overline{E}$ is set at a low level, so that the transistor Tr7 is turned on to supply the high voltage $V_{pp}$ to the terminal $V_{S1}$ of the cell array 1b. The output signals of the OR gates 5a and 5b become a high level, while the output signals of the AND gates 2d to 2i all become low. Data erasing is thus executed in the individual cell transistors in the cell array 1b.

In writing data, the erase signal $\overline{E}$ becomes high and the write signal $\overline{W}$ low. The ground potential is then supplied to the terminal $V_{S1}$ of the cell array 1b. One word line WL is selected by the address signal A1, and one bit line BL is selected by address signal A0. When the level of the input data $D_{in}$ becomes high, the high voltage $V_{pp}$ is applied to the selected bit line BL. As a result, the high voltage $V_{pp}$ is supplied to the drain and gate of the selected cell transistor in the cell array 1b, with the ground potential supplied to the source of that cell transistor, allowing data to be written there.

Figure 6:
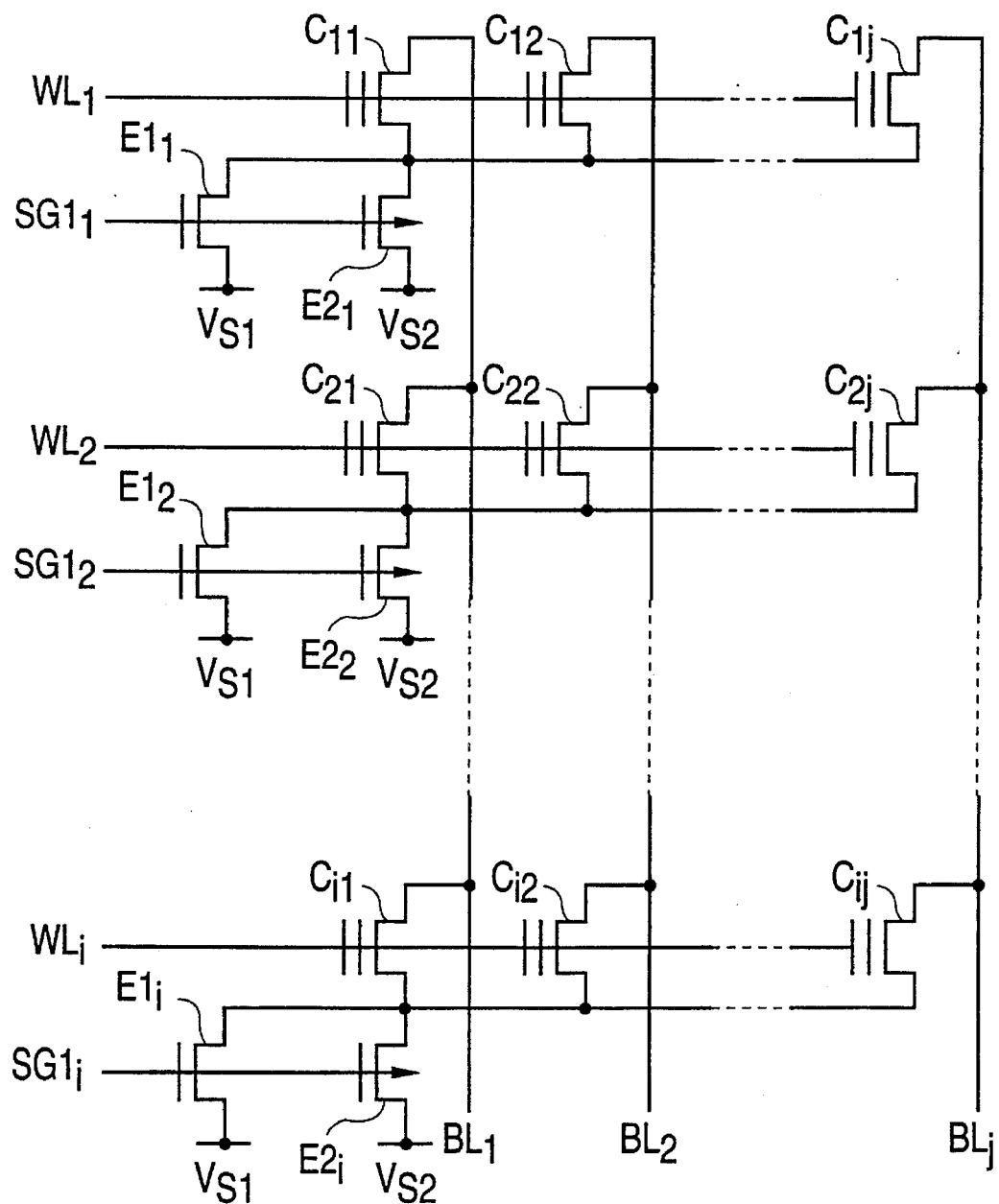
FIG. 6 is a schematic diagram illustrating a fourth embodiment of the present invention.

Next, a cell array in accordance with a fourth embodiment of the present invention will be described referring to FIGS. 6 to 10. As shown in FIG. 6, a first power supply $V_{s1}$ is connected to the sources of cell transistors C in each row through a corresponding N-channel MOS transistor (a first select element $E1_m$). A second power supply $V_{s2}$ is connected to sources of cell transistors C in each row through a P-channel transistor (a second select element $E2_m$). When a word line $WL_m$ is selected, a select signal $SG1_m$ is input into both of the corresponding select elements $E1_m$ and $E2_m$. According to this signal $SG1_m$, the first select element $E1_m$ is turned on and the second select element $E2_m$ is turned off. Then, the sources of the cell transistors $C_{m1}$–$C_{mj}$ are electrically connected to the power supply $V_1$.

When the word line $WL_m$ is not selected, the first select element $E1_m$ is turned off and the second select element $E2_m$ is turned on in accordance with the signal $SG1_m$. Therefore, the sources of the cell transistors $C_{m1}$–$C_{mj}$ are electrically connected to the power supply $V_{s2}$. With this arrangement, the potential of the non-elected cell transistors and the potential of the bit line are maintained at substantially the same level and are thus deactivated.

Figure 7:
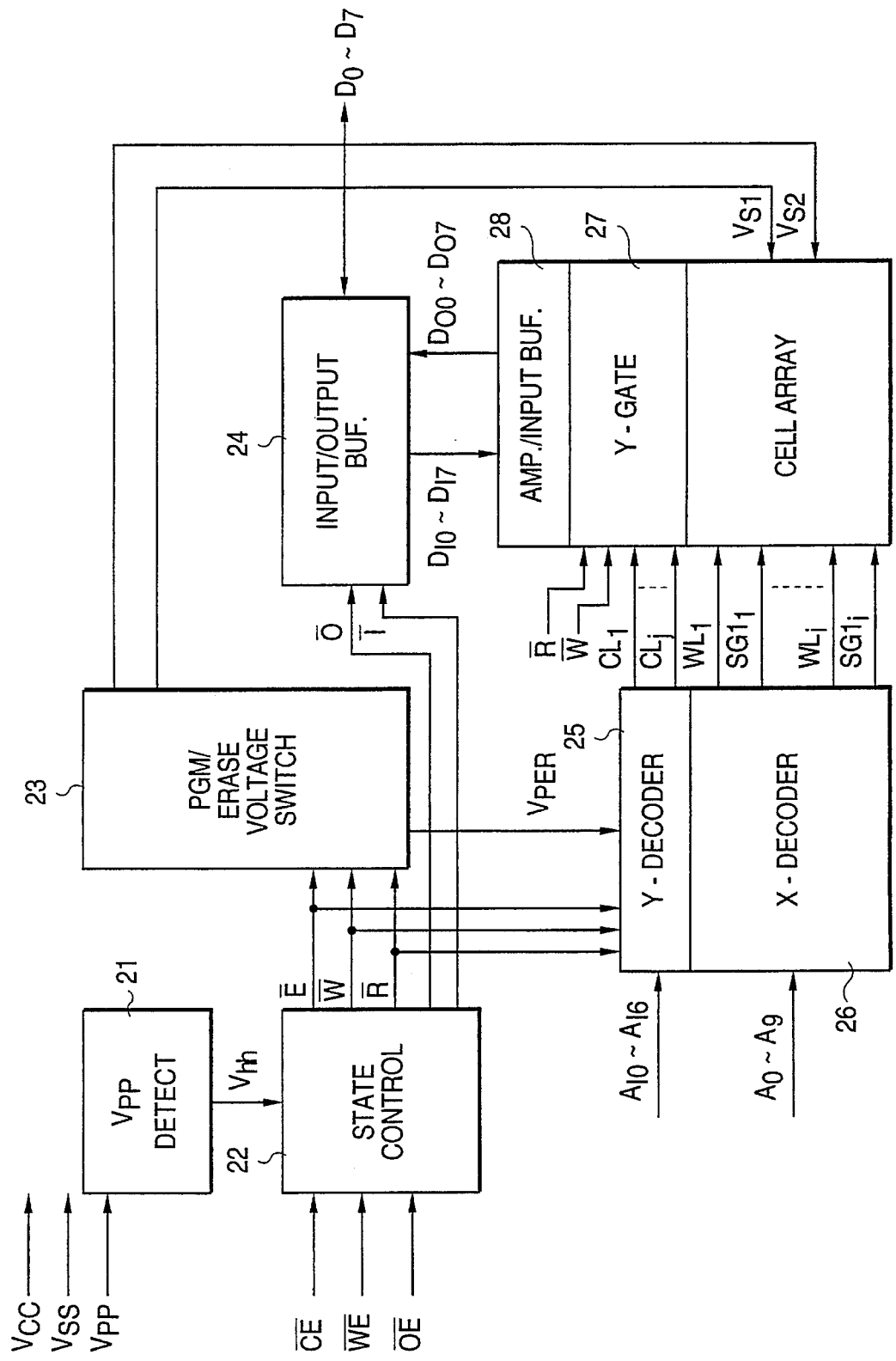
FIG. 7 is a block diagram showing the memory control circuitry of a semiconductor memory device using a cell array in accordance with the fourth embodiment of this invention.

A semiconductor memory device using the cell array shown in FIG. 6 will be described referring to FIG. 7. The device has a voltage detector 21, a state control circuit 22, a program/erase voltage switch 23, an input/output buffer 24, an X-decoder 26, a Y-decoder 25, a Y-gate 27 and an amplifier 28.

The voltage detector 21 judges whether a high voltage $V_{pp}$ is available. If so, the voltage detector outputs a "high" signal $V_{hh}$ to the state control circuit 22. If not, a "low" $V_{hh}$ signal is output.

The state control circuit 22 receives a chip enable signal $\overline{CE}$, a write enable signal $\overline{WE}$ and an output enable signal $\overline{OE}$ in addition to the signal $V_{hh}$. From these signals, the desired mode can be determined. For example, the read, write and erase modes can all be determined. In response to these signals, the state control circuit 22 outputs an output control signal $\overline{O}$, an input control signal $\overline{I}$, an erase signal $\overline{E}$, a write control signal $\overline{W}$ and a read signal $\overline{R}$.

For example, when the read mode is set, the state control circuit 22 receives a "low" chip enable signal $\overline{CE}$, a "low" output enable signal $\overline{OE}$ and a "high" write enable signal $\overline{WE}$.

At the same time, the voltage signal $V_{hh}$ is "low". In turn, the state control circuit provides "low" output control $\overline{O}$ and read $\overline{R}$ signals.

When the write mode is set, the state control circuit 22 receives a "high" voltage signal and a "high" output enable signal $\overline{OE}$. At the same time, the chip enable signal $\overline{CE}$ and the write enable signal $\overline{WE}$ are "low". In turn the state control circuit outputs a "low" input control signal $\overline{I}$, and a "low" write signal $\overline{W}$.

When the erase mode is set, the state control circuit 22 outputs a "low" erase signal $\overline{E}$. This is done in response to the input of a "high" voltage signal $V_{hh}$, a "high" chip enable signal $\overline{CE}$, a "high" output enable signal $\overline{OE}$ and a "low" write enable signal $\overline{WE}$.

When the program/erase voltage switch 23 receives a "low" erase signal $\overline{E}$, it switches the voltage of the cell array power supply $V_{s1}$ to the high voltage $V_{pp}$. When a "low" erase signal or a "low" write signal is input, the switch 23 switches an output voltage $V_{per}$ into the high voltage $V_{pp}$.

This voltage is supplied to the Y-decoder 25.

When a declining step input control signal $\bar{I}$ is received by the input/output buffer 24, the buffer latches input data $D_{in}$ that is received from an external device. The input data is then output to the cell array. In contrast, when a declining step output control signal $\bar{O}$ is received, the buffer 24 latches output data $D_{out}$ from the cell array, and then outputs the data to the external device.

The X-decoder is arranged to receive the address signals $A_m$ (m=0 to 9), the write signal $\bar{W}$, the read signal $\bar{R}$ and the erase signal $\bar{E}$. In response to these inputs, the X-decoder 26 outputs a select signal $SG1_m$ ("high" level) to the cell array in order to select the desired word line $WL_m$. At the same time, a "high" level signal is sent to the selected word line $WL_m$.

The Y-decoder 25 is arranged to receive the address signals $A_n$ (n=10 to 16), the write signal $\bar{W}$ and the read signal $\bar{R}$. In response to these inputs, the Y-decoder 25 outputs a bit line control signal $CL_n$ to a Y-gate. The Y-gate 27 selects the bit line $BL_n$ in order to read and write data responding to the bit line control signal $CL_n$.

More specifically, in the write mode (i.e. when the write signal $\bar{W}$ is "low"), a high voltage $V_{pp}$ is supplied to the selected bit line $BL_n$. Then, the input data $D_{in}$ is input into the bit lines from the buffer 24.

In the read mode, (i.e. when a "low" read signal $\bar{R}$ is input into the Y-gate 27) the selected bit line $BL_n$ is connected to an amplifier 28. Then, the cell information is output from the amplifier 28 as the output data $D_{out}$.

Figure 8:
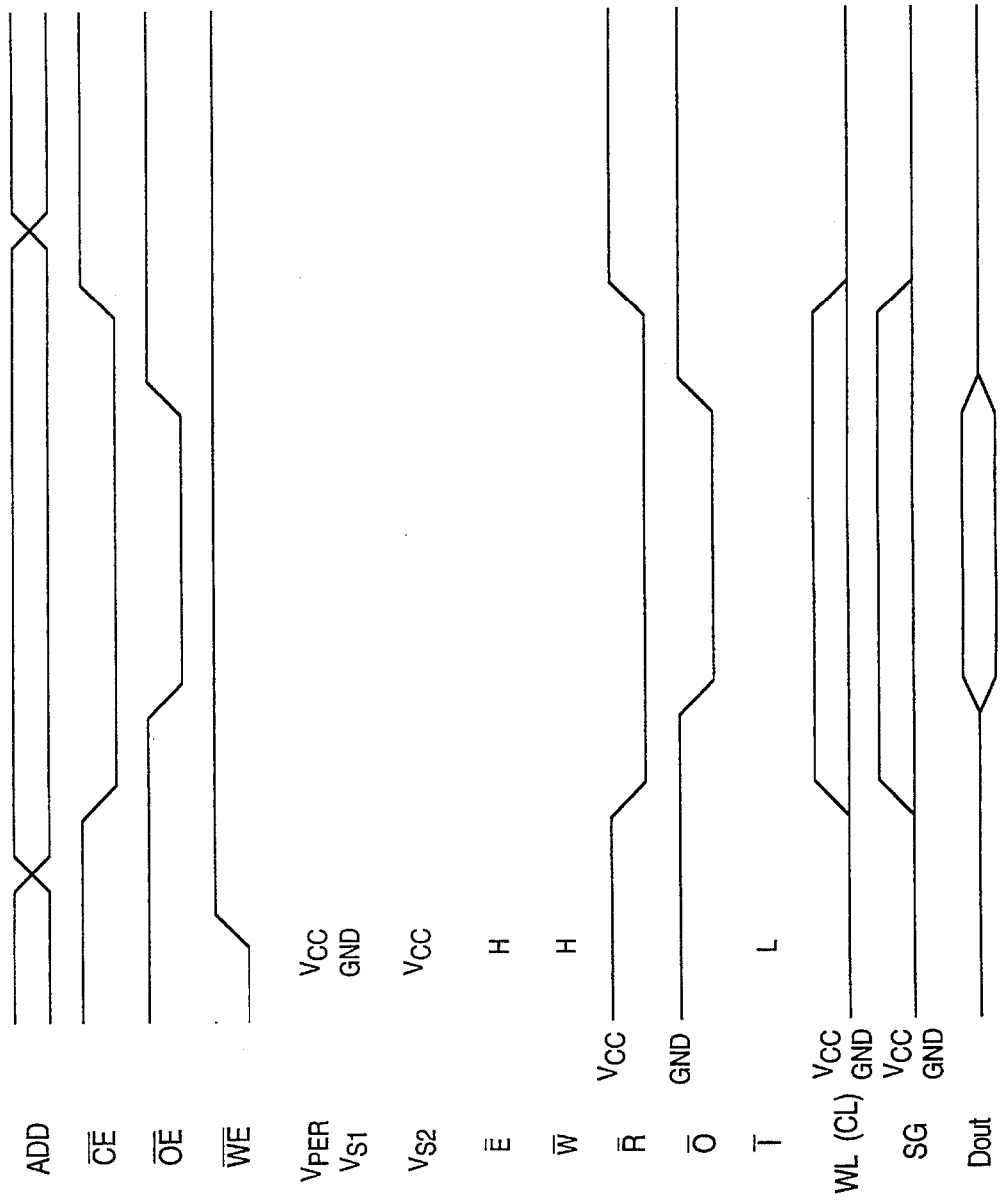
FIG. 8 is a timing diagram showing the output levels of various signals in the memory control circuitry shown in FIG. 7 in the read mode.

FIG. 8 is a timing diagram showing the output levels of various signals in the read mode. In the figure, the letter "L" indicates "low" while the letter "H" indicates "high". The set signals include: $V_{hh}$=L, $V_{per}$=$V_{cc}$, $V_{s1}$=ground, $V_{s2}$=$V_{cc}$, $\bar{E}$=H, $\bar{W}$=H and $\bar{I}$=L. In this state, the write enable signal $\overline{WE}$ and the address signal are input into the state control circuit 22, X and Y decoders 25 and 26 respectively. For the purposes of illustration, we will assume that the desired cell transistor is $C_{11}$. In this condition the chip enable signal $\overline{CE}$ is shifted "low", which causes the read signal $\bar{R}$ to shift "low". Accordingly, a select signal $SG1_m$ ($SG1_1$) having a voltage level of "$V_{cc}$" is input into the select elements $E1_m$ and $E2_m$ which correspond to the address signal (in this case, $E1_1$ and $E2_1$). Thus, the first select element $E1_m$ ($E1_1$) turns on and the second select element $E2_m$ ($E2_1$) turns off. Therefore, the select signal $SG_m$ having a voltage level of "$V_{pp}$" level is input into the both select elements $E1_m$ and $E2_m$. In this condition, the first select element $E1_m$ turns on while the second select element $E2_m$ turns off. Then, one word line $WL_m$ ($WL_1$) is selected. Accordingly, the source of each cell transistor in the selected word line $WL_m$ ($WL_1$) is connected to the power supply $V_{s1}$ and the potentials thereof shift to ground level.

In response to the input of the address signal, the bit line control signal $CL_n$ ($CL_1$) which corresponds to the address signal shifts to the "$V_{cc}$" level. Then, the corresponding bit line $BL_n$ ($BL_1$) is selected. Accordingly, the data from the cell transistor $C_{mn}$ ($C_{11}$) specified by the address is read. Thus, when both of the output enable signal and the output control signal shift to a "low" level, the information in the cell transistor $C_{mn}$ ($C_{11}$) is output as the output signal $D_{out}$.

In the above case, even if one or more of the non-selected cell transistors is over-erased, only the first select element will be turned on. Therefore, the operation of reading the information in a selected cell transistor is not affected by over-erased transistors.

Figure 9:
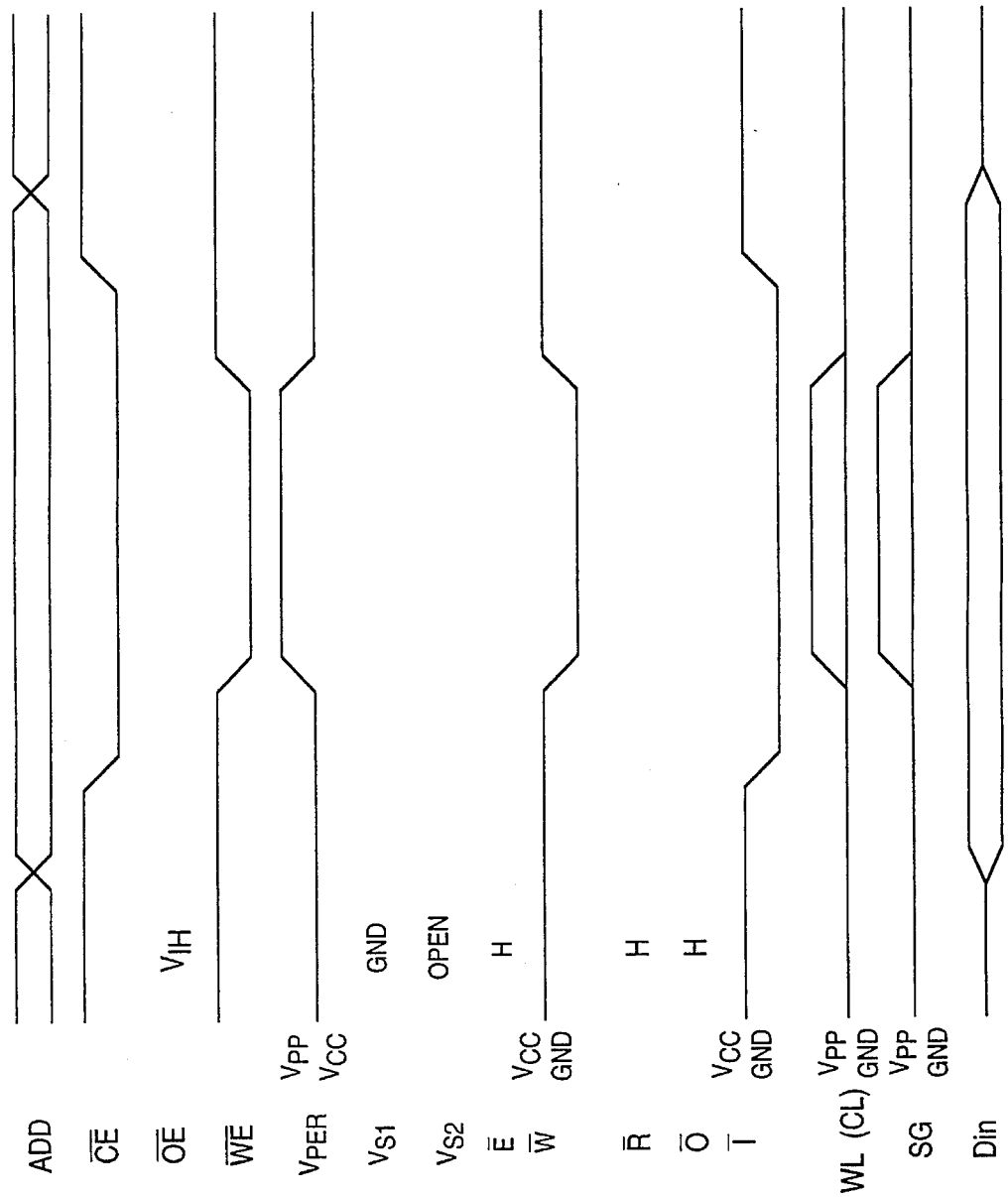
FIG. 9 is a timing diagram showing the output levels of various signals in the write mode.

FIG. 9 is a timing diagram showing the output levels of various signals in the write mode. In the write mode, the output levels of various signals are set as follows: $V_{hh}$=H, $V_{s1}$=ground, $V_{s2}$=open, $\overline{OE}$=H, $\bar{E}$=H, $\bar{R}$=H and $\bar{O}$=H. In the above state, the address signal, a "low" chip enable signal $\overline{CE}$ and a "low" output control signal $\bar{O}$ are input into the appropriate circuits. Thereafter, the voltage signal $V_{per}$ switches to the "$V_{pp}$" level, and the write enable signal $\overline{WE}$ and the write signal $\bar{W}$ shift to "low" levels. Accordingly, the word line $WL_m$ that corresponds to the address signal is selected. Additionally a select signal $SG1_m$ at a "$V_{pp}$" level is input into the select elements $E1_m$ and $E2_m$ which correspond to the selected word line. Thus, the associated first select element $E1_m$ is turned on and the associated second select element $E2_m$ is turned off. This insures that the source of each cell transistor in the selected word line is connected to the power supply $V_{s1}$, which in this case is at ground level.

In response to the address signal, the bit line control signal $CL_n$ which corresponds to the address signal shifts to the "$V_{pp}$" level. Therefore, one bit line $BL_n$ is selected. Accordingly, one cell transistor $C_{mn}$ is specified, and then, the input data $D_{in}$ are programmed into the cell transistor $C_{mn}$.

Figure 10:
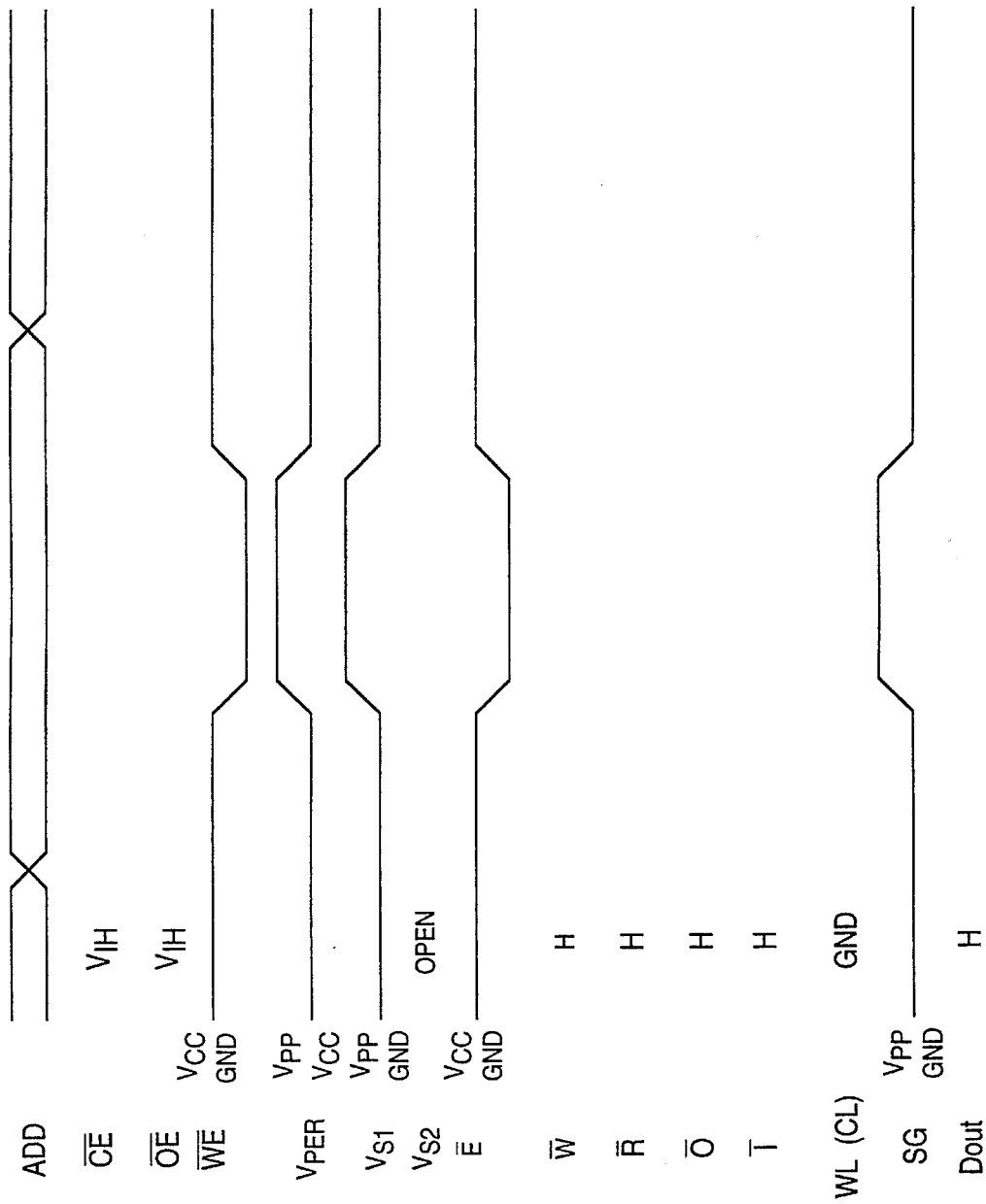
FIG. 10 is a timing diagram showing the output levels of various signals in the erase mode.
Figure 11:
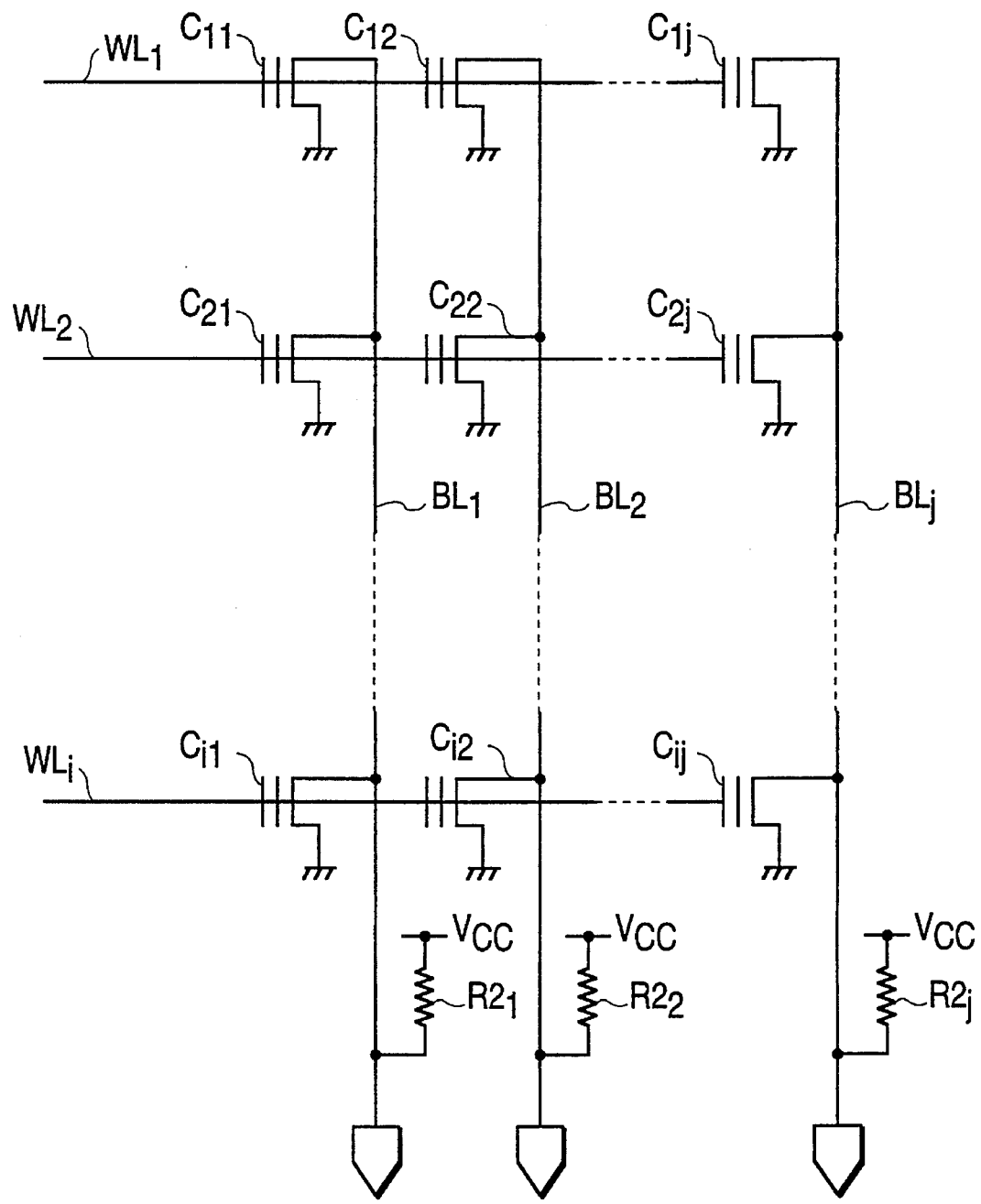
FIG. 11 is a circuit diagram showing a conventional cell array.
Figure 12:
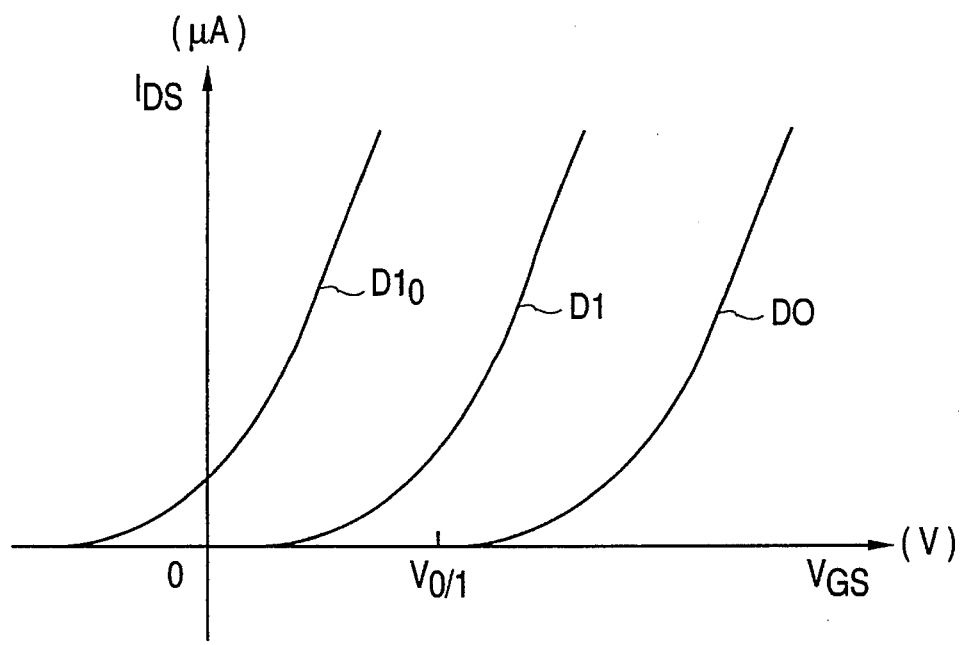
FIG. 12 is a graph showing the characteristics of the cell transistors of a tunnel-erase EEPROM.
Figure 13:
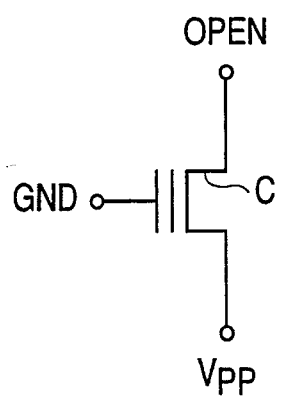
FIG. 13 is a schematic diagram of a cell transistor illustrating the voltages applied to the cell transistor to erase data therein.
Figure 14:
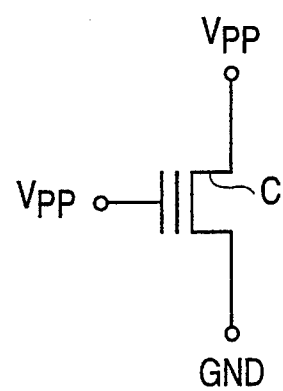
FIG. 14 is a schematic diagram of a cell transistor shown in FIG. 13, illustrating the voltages applied to write data therein.

FIG. 10 is a timing diagram showing the output levels of various signals in the erase mode. The output levels of various signals are set as follows: Vhh=H, $\overline{CE}$=H, $\overline{OE}$=H, $V_{s2}$=open, $\bar{W}$=H, $\bar{R}$=H, $\bar{O}$=H, $\bar{I}$=H, $WL_i$=ground, $CL_j$=ground and $D_{out}$=H. In this above state, the voltages $V_{per}$ and $V_{s1}$ are shifted to the "$V_{pp}$" level. The write enable signal $\overline{WE}$ at a "low" level and the erase signal $\bar{E}$ at a "low" level are input. Therefore, the select signals $SG_i$ at "$V_{pp}$" levels are input into all select elements $E1_i$ and $E2_i$, all of the first select elements $E1_i$ are turned on and all of the second elements $E2_i$ are turned off. In this case, since each of the word lines and each of the bit line control signals are fixed at the ground levels, all of the sources of the cell transistors are connected to the power supplies $V_{s1}$ through the first select elements. Thus, the voltage at "$V_{pp}$" level is applied to the each of the sources. Accordingly, the information in all of the cell transistors is erased simultaneously.

Although only a few embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope of the appended claims. As described above, an electrically erasable and electrically programmable non volatile semiconductor device according to the present invention has a cell array comprised of tunnel-erase cell transistors with a double-gate structure including a floating gate. The semiconductor memory device is excellent in preventing reading failure even if a cell transistor is in an over-erase condition.

What is claimed is:

1. An electrically programmable and electrically erasable non-volatile semiconductor memory device, comprising:

a cell array having a plurality of electrically erasable and programmable non-volatile cell transistors arranged in rows and columns, each of said cell transistors including a source, a drain and a control gate;

a plurality of word lines, each of said word lines being associated with a particular one of said cell transistor rows, each word line being connected to the control gates of each of its associated cell transistors;

a plurality of bit lines, each of said bit lines being associated with a particular one of said cell transistor columns such that any one of said cell transistors can be selected for writing or reading cell information by selecting the word line and the bit line associated with the selected cell transistor based on first and second selection signals;

a plurality of first select elements, each first select element being connected to the sources of the cell transistors in an associated row of said cell transistors in said cell transistor array, said first select elements being arranged to activate the selected cell transistor, wherein said first select elements are arranged to be activated in synchronism with the selection of their associated word lines to electrically connect the sources of their associated cell transistors to a first power supply based on a third selection signal when their associated word line is selected; and a plurality of regulating elements, each of which is associated with a particular row of said cell transistors for electrically connecting the sources of their associated cell transistors to a second power supply having a potential different from a potential of the first power supply where their associated word line is not selected.

2. A non-volatile semiconductor device as recited in claim 1, wherein said regulating elements are resistors.

3. A non-volatile semiconductor device as recited in claim 1, wherein said regulating elements are regulating transistors.

4. A non-volatile semiconductor device as recited in claim 1, wherein each of said first select elements comprises an N-channel type MOS transistor, and wherein a gate of each said N-channel type MOS transistor is connected to its associated word line, a drain of each said N-channel type MOS transistor is connected to the sources of each of said cell transistors in its associated word line, and a source of said N-channel type MOS transistor is connected to the first power supply.

5. A non-volatile semiconductor device as recited in claim 4, wherein said regulating elements are P-channel type MOS transistors.

6. A non-volatile semiconductor device as recited in claim 5, wherein each of said P-channel type MOS transistors is activated at the same time as the corresponding one of said first select elements.

7. A non-volatile semiconductor device as recited in claim 1, wherein the first power supply is set at ground potential.

8. An electrically programmable and electrically erasable non-volatile semiconductor memory device comprising:

a cell array having a plurality of electrically erasable and electrically programmable non-volatile single transistor cells functionally arranged in rows and columns, each of said transistor cells including a source, a drain, a control gate and a floating gate;

a plurality of word lines, each of said word lines being associated with a particular one of said transistor cell rows, each of said word lines being connected to the control gates of each of its associated transistor cells;

a plurality of bit lines, each of said bit lines being associated with a particular one of said transistor cell columns;

select means for reading information from and writing information into any selected one of said transistor cells, said select means being arranged to select the word line and the bit line associated with the selected transistor cell based on first and second selection signals; and switching means for alternately supplying first and second potentials to the sources of said transistor cells, said switching means being actuated by a third selection signal and arranged such that during reading operations, the sources of transistor cells in a selected row are supplied with the first potential to permit reading of those transistor cells, and the sources of transistor cells in unselected rows are supplied with the second potential to insure that their associated transistor cells remain off during the read operation.

9. A non-volatile semiconductor device as recited in claim 8, further comprising:

a plurality of select lines, each of which is associated with a particular row of said transistor cell array, each of said select lines being arranged to electrically couple the sources of said transistor cells in its associated cell array, wherein said switching means includes a plurality of select elements, wherein each of said select elements is connected to an associated one of said select lines, said select elements being arranged to be activated in synchronism with the selection of their associated word lines to electrically connect the sources of their associated cell transistors to a first power supply at said first potential when the associated one of said word lines is selected.

10. A method of reading information from an electrically programmable and electrically erasable non-volatile semiconductor memory device comprising a cell array formed from single transistor cells, each having a source, a drain, a control gate and a floating gate, the cell array being functionally divided into a multiplicity of rows and columns, each row having an associated word line connected to the control gates of the transistor cells in that row, and each column having a bit line connected to the drains of the transistor cells in that column, the method comprising the steps of:

selecting the row of the desired transistor cells and activating only the transistors cells in the selected row by applying a first selection signal to the control gates of the transistor cells in the selected row and by connecting the sources of the transistor cells in the selected row to a first potential based on a second selection signal, while maintaining the sources of the transistor cells in unselected rows at a second potential that does not activate the transistor cells;

selecting the column of the desired transistor cell and reading information from the bit line associated with the selected column; and electrically connecting the sources of the transistor cells for a particular row of the transistor cells to a second potential different from the first potential when their associated word line is not selected.

11. A method as recited in claim 10, wherein the first potential is at ground level.

12. A non-volatile electrically erasable semiconductor memory device, comprising:

a cell array including non-volatile electrically erasable transistors arranged in rows and columns, each of said transistors including first, second and third terminals;

word lines respectively associated with said transistor rows, each of said word lines being connected to the first terminal of each of said transistors in the corresponding one of said transistor rows;

bit lines respectively associated with said transistor columns;

first select elements respectively associated with said word lines and connected to the second terminals of said transistors in the corresponding one of said transistor rows, said first select elements electrically connecting the second terminals of the corresponding one of said transistor rows to a first power supply based on a second selection signal when the associated one of said word lines is selected based on a first selection signal; and a plurality of regulating elements, each of which is associated with a particular row of said transistors for electrically connecting the second terminals of the transistors in the associated row to a second power supply having a potential different from a potential of the first power supply, when the associated one of said word lines is not selected.

13. A non-volatile electrically erasable semiconductor memory device, comprising:

a cell array non-volatile electrically erasable single transistor cells arranged in rows and columns, each of said single transistor cells including first, second, and third terminals;

word lines respectively associated with said transistor cell rows, each of said word lines being connected to the first terminal of each of said single transistor cells in the corresponding one of said transistor cell rows, one of said word lines being selected based on a first selection signal;

bit lines respectively associated with said transistor cell columns;

means for applying a first potential to the second terminals of said single transistor cells in the one of said transistor cell rows which corresponds to a selected word line based on a second selection signal; and a plurality of regulating elements, each of which is associated with a particular transistor cell row for electrically connecting the second terminals of the transistors in the associated transistor cell row to a second potential different from the first potential when the associated word line is not selected.

* * * * *